(12) United States Patent
Shinohara et al.

(10) Patent No.: US 9,261,553 B2
(45) Date of Patent: Feb. 16, 2016

(54) PROBE APPARATUS

(71) Applicant: Tokyo Electron Limited, Tokyo (JP)

(72) Inventors: Eiichi Shinohara, Nirasaki (JP);
Munetoshi Nagasaka, Nirasaki (JP);
Isamu Inomata, Nirasaki (JP); Kazuya Yano, Nirasaki (JP); Yoshiyasu Kato, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 67 days.

(21) Appl. No.: 14/444,180

(22) Filed: Jul. 28, 2014

(65) Prior Publication Data
US 2015/0028907 A1    Jan. 29, 2015

(30) Foreign Application Priority Data

Jul. 29, 2013  (JP) ................................. 2013-156505

(51) Int. Cl.
| | | |
|---|---|---|
| G01R 31/00 | (2006.01) | |
| G01R 31/26 | (2014.01) | |
| G01R 1/073 | (2006.01) | |
| G01R 31/28 | (2006.01) | |

(52) U.S. Cl.
CPC ........ *G01R 31/2601* (2013.01); *G01R 1/07342* (2013.01); *G01R 31/2886* (2013.01)

(58) Field of Classification Search
CPC ........... G01R 31/2886; G01R 31/2893; B25B 11/005
See application file for complete search history.

(56) References Cited

U.S. PATENT DOCUMENTS

| | | | | |
|---|---|---|---|---|
| 4,906,011 A | * | 3/1990 | Hiyamizu | ............. B25B 11/005 269/21 |
| 6,323,663 B1 | * | 11/2001 | Nakata | ................. G01R 1/0491 324/756.03 |
| 7,112,889 B1 | * | 9/2006 | Maruyama | .............. H01L 22/32 118/500 |

FOREIGN PATENT DOCUMENTS

| | | |
|---|---|---|
| EP | 2 546 668 A1 | 1/2013 |
| JP | 2011-089891 A | 5/2011 |
| JP | 2012-058225 A | 3/2012 |
| WO | 2007/023501 A2 | 3/2007 |

* cited by examiner

*Primary Examiner* — Minh N Tang
(74) *Attorney, Agent, or Firm* — Pearne & Gordon LLP

(57) ABSTRACT

A probe apparatus of inspecting electrical characteristics of a power device having electrodes on both sides of a substrate at wafer level can reduce and uniformize a contact resistance between the electrode on a rear surface of the substrate and a mounting surface conductor of a chuck top. In the probe apparatus, an attracting device supports a semiconductor wafer W on the chuck top 12, and has many vertical fine holes in a pattern (diameter $\phi$ and pitch p) that satisfies the condition of $\phi < p \le 2\phi$. For example, the diameter $\phi$ is about 0.25 mm, and the pitch p is about 0.5 mm.

14 Claims, 9 Drawing Sheets

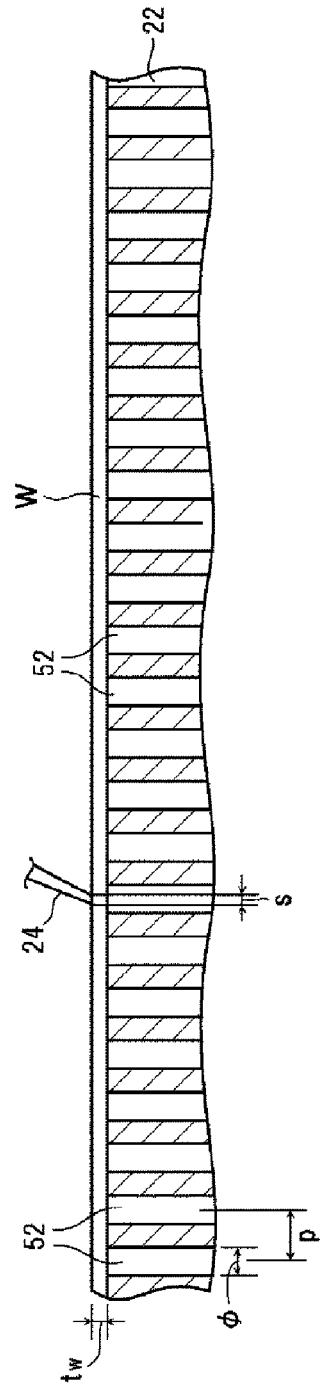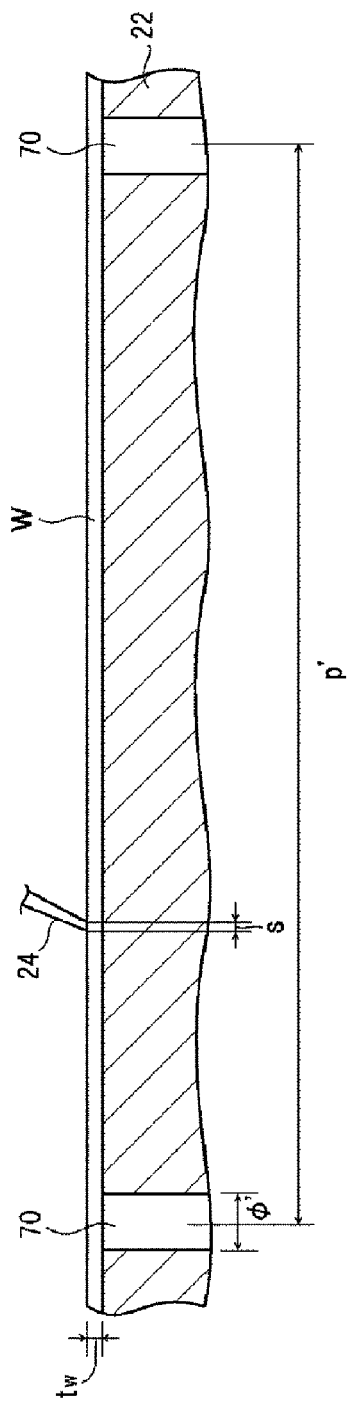

Φ=0.2mm, P=0.3mm
AR=34%

Φ=0.3mm, P=0.4mm
AR=44%

Φ=0.4mm, P=0.5mm
AR=50%

Φ=0.5mm, P=0.6mm
AR=57%

Φ=0.6mm, P=0.7mm
AR=55%

PROBE APPARATUS

CROSS-REFERENCE TO RELATED APPLICATION

This application claims the benefit of Japanese Patent Application No. 2013-156505 filed on Jul. 29, 2013, the disclosures of which are incorporated herein by reference.

TECHNICAL FIELD

The various embodiments described herein pertain generally to a probe apparatus of inspecting electrical characteristics of a power device having electrodes on both sides of a substrate at wafer level.

BACKGROUND

In a manufacturing process of a semiconductor device, electrical characteristics of the semiconductor device are inspected by a semiconductor testing apparatus at the end of a pre-process or a post-process, so that faults of chips are inspected. In such a semiconductor testing apparatus, a probe apparatus serves as a handling apparatus that interfaces the chips on the semiconductor wafer, and a tester in charge of signal processing when performing an inspection at wafer state or at wafer level. Typically, the probe apparatus includes a movable chuck top (mounting table) configured to mount and support thereon the semiconductor wafer; a probe card having probe needles to be brought into contact with electrodes of each chip, thus allowing the chips to be electrically connected with the tester; and a moving device configured to move the chuck top to align the inspection target chips with respect to the probe needles or to the probe card fixed at a certain position.

As for the semiconductor device for power supply, i.e., a so-called power device such as a power MOSFET or an IGBT, electrodes are formed on both sides of a chip and an electric current is flown in a thickness direction of the chip in order to supply a high current at a high voltage. As for the power MOSFET, for example, a source electrode and a gate electrode are formed on a front surface of a chip, while a drain electrode is formed on a rear surface of the chip. If a constant control voltage is applied to the gate electrode, a high current can be flown between the source electrode and the drain electrode. In case of an IGBT, an emitter electrode and a gate electrode are formed on a front surface of a chip, while a collector electrode is formed on a rear surface of the chip. If a constant control voltage is applied to the gate electrode, a current larger than that of the power MOSFET may be flown between the emitter electrode and the collector electrode.

In the probe apparatus of inspecting electrical characteristics of a power device having electrodes on both sides of a chip at wafer level, in order to electrically connect the tester with the power device or each chip to be inspected, probe needles of a probe card positioned above a semiconductor wafer are brought into contact with electrodes (gate electrode and source electrode/emitter electrode) formed on a front surface of the semiconductor wafer. Meanwhile, as for an electrode (drain electrode/collector electrode) formed on a rear surface of the semiconductor wafer, a top surface of the chuck top is made of a plate-shaped conductor, i.e., a mounting surface conductor, and the electrode formed on the rear surface of the semiconductor wafer and the mounting surface conductor are electrically connected by being brought into direct contact with each other. Further, a measurement line or a transmission line through which a current outputted from the power device is flown may be provided between the mounting surface conductor of the chuck top and a corresponding terminal of the tester.

Generally, in the probe apparatus, the semiconductor wafer needs to be held at a certain position on the chuck top in order to align the semiconductor wafer with the probe card or the probe needles accurately. For the purpose, a vacuum evacuation type attracting device has been used.

Conventionally, as such an attracting device, there are known two types depending on the shape of a vacuum suction hole formed on a mounting surface of the chuck top: a groove type in which a multiple number of annular recesses (suction grooves) are formed concentrically and a hole type in which a multiple number of holes (suction holes) are formed at a regular pitch. Typically, in the groove type attracting device, annular suction grooves each having a groove width of, e.g., about 0.5 mm are concentrically arranged at distance of, e.g., about 15 mm to about 20 mm therebetween in a radial direction. Meanwhile, in the hole type attracting device, suction holes each having a diameter of, e.g., about 0.5 mm are arranged in a lattice shape at a pitch of, e.g., about 10 mm. Accordingly, in case that the mounting table has a size of, e.g., about 8 inches (about 200 mm), the total number of the annular suction grooves in the groove type attracting device may be 6 to 8, and the total number of the suction holes in the hole type attracting device may be in the range from about 300 to about 400. In both of the groove type attracting device and the hole type attracting device, the suction grooves or the suction holes are formed in the mounting surface conductor of the chuck top by mechanical machining such as turning or drilling.

Patent Document 1: Japanese Patent Laid-open Publication No. 2011-089891

Patent Document 2: Japanese Patent Laid-open Publication No. 2012-058225

In the probe apparatus of inspecting the electrical characteristics of the power device having the electrodes on both sides of the substrate at wafer level, the semiconductor wafer is fixed at a certain position on the chuck top by using a vacuum attracting force of the attracting device, and, at the same time, the rear surface of the semiconductor wafer is electrically connected with the mounting surface conductor by being brought into direct contact with the mounting surface conductor. In such a conventional probe apparatus, however, a high electric resistance (wafer contact resistance) on a contact surface between the electrode on the rear surface of the wafer and the mounting surface conductor of the chuck top has been a problem to be solved.

That is, if a constant control voltage is applied to the gate electrode of the power device, the source electrode (or the emitter electrode) and the drain electrode (or the collector electrode) are electrically connected, and the power device is turned on. Here, the power device outputs a current of several hundreds of ampere (A) when a high voltage of, e.g., several thousands of voltage (V) is applied from the tester. This outputted current is introduced to the tester. In inspection of dynamic characteristics, a turn-on time or a turn-off time is measured, whereas in inspection of static characteristics, an on-resistance or the like is measured. Thus, in consideration of measurement accuracy and power loss, it may be desirable that impedance of an outgoing measurement line from the tester to the electrode (the drain electrode or the collector electrode) on the rear surface of the power device is low.

In the conventional probe apparatus, however, since the wafer contact resistance is high, it has been difficult to lower the impedance of the outgoing measurement line. Especially, in the aspect of measurement accuracy, since the wafer contact resistance on the mounting surface of the chuck top is highly non-uniform, reproducibility of measurement in the inspection of electrical characteristics at wafer level has been poor.

SUMMARY

In view of the foregoing problems, example embodiments provide a probe apparatus capable of improving measurement accuracy and power consumption efficiency in inspection of electrical characteristics of a power device having electrodes on both surfaces of a substrate, by reducing and uniformizing a contact resistance between an electrode on a rear surface of the substrate and a mounting surface conductor of a chuck top.

In one example embodiment, a probe apparatus inspects an electrical characteristic of a power device that is formed on a substrate to be inspected and has electrodes on front and rear surfaces of the substrate. The probe apparatus includes a movable chuck top configured to mount and support the substrate thereon; a probe card that is provided above the chuck top to face the chuck top and is configured to support a probe needle having a leading end to be brought into contact with a front surface electrode of the power device exposed at the front surface of the substrate supported on the chuck top; a first measurement line, having the probe needle, configured to electrically connect the front surface electrode of the power device to a corresponding first terminal of a tester; a mounting surface conductor that serves as a mounting surface on the chuck top and is configured to be brought into contact with a rear surface electrode of the power device exposed at the rear surface of the substrate; a second measurement line, having the mounting surface conductor, configured to electrically connect the rear surface electrode of the power device to a corresponding second terminal of the tester; and an attracting device, having many vertical fine holes which are densely distributed in an attraction region set on the mounting surface and each of which is vertically extended from a surface of the mounting surface conductor to an inner portion thereof, configured to apply a vacuum attracting force to the rear surface of the substrate through the vertical fine holes. Further, in the attraction region, the vertical fine hole satisfies a condition of $\phi < p \leq 2\phi$ when $\phi$ denotes a diameter of the vertical fine hole and p denotes a pitch therebetween.

In the probe apparatus of the example embodiment, the attracting device configured to apply the vacuum attracting force to the rear surface of the substrate held on the chuck top has many vertical fine holes in a pattern (diameter $\phi$ and pitch p) that satisfies the condition of $\phi < p \leq 2\phi$. With this configuration, it may be possible to greatly reduce and uniformize a contact resistance (wafer contact resistance) between the electrode on the rear surface of the substrate and the mounting surface conductor.

In accordance with the probe apparatus of the example embodiments, by using the aforementioned configurations and operations, it may be possible to reduce and uniformize the contact resistance between the electrode on the rear surface of the substrate and the mounting surface conductor of the chuck top. Accordingly, it may also be possible to improve the power consumption efficiency and the measurement accuracy in inspecting the electrical characteristics of the power device having the electrodes on both surfaces of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7A and FIG. 7B are longitudinal cross sectional views illustrating a state in which a semiconductor wafer is attracted to the mounting surface conductor through vertical fine holes of an experimental example and a state in which a semiconductor wafer is attracted to the mounting surface conductor through vertical holes of a comparative example, respectively;

DETAILED DESCRIPTION

Figure 1:
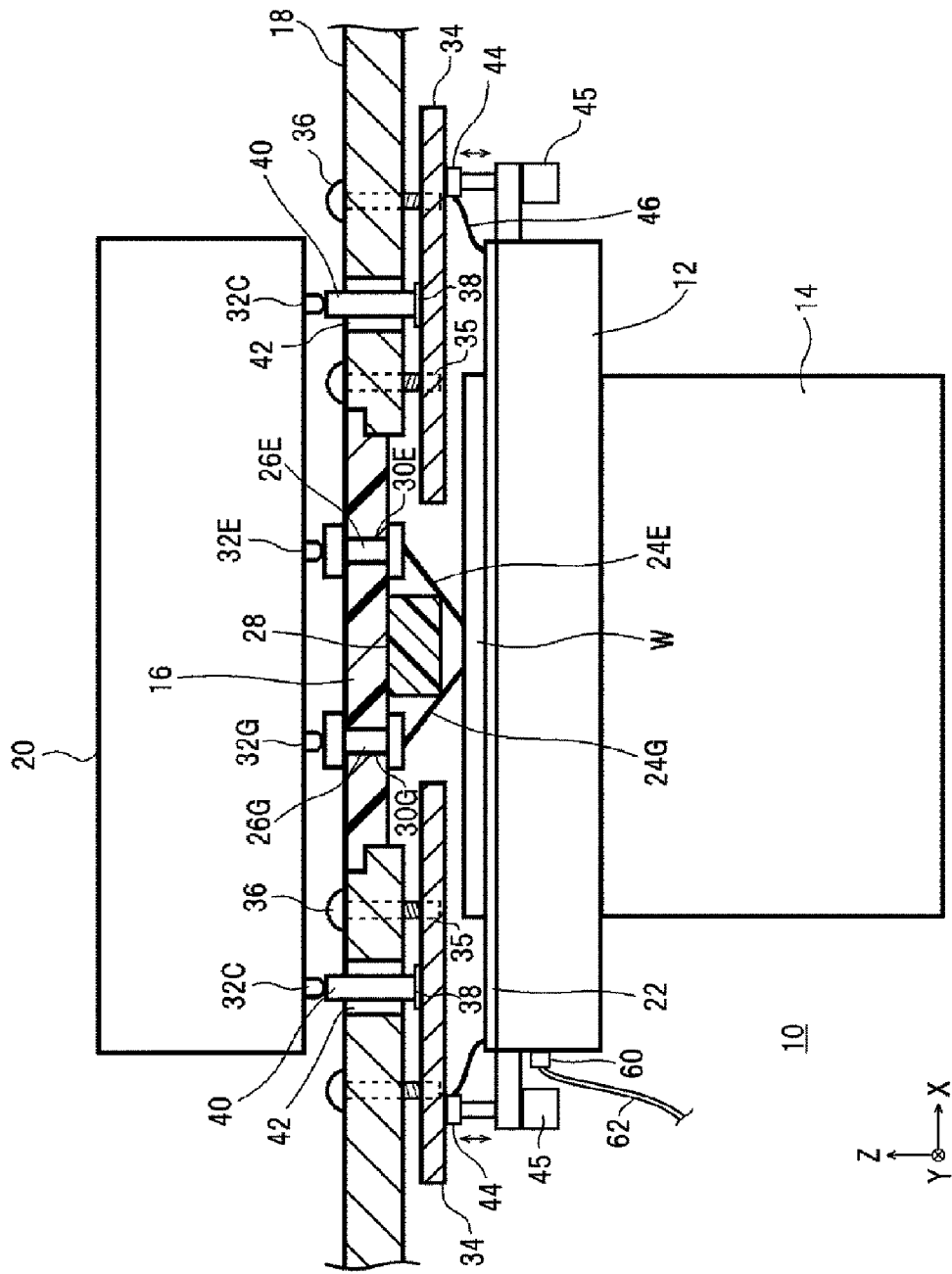
FIG. 1 is partially cross sectional front view illustrating a configuration of a probe apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

(Overall Configuration and Operation of Probe Apparatus)

Figure 2:
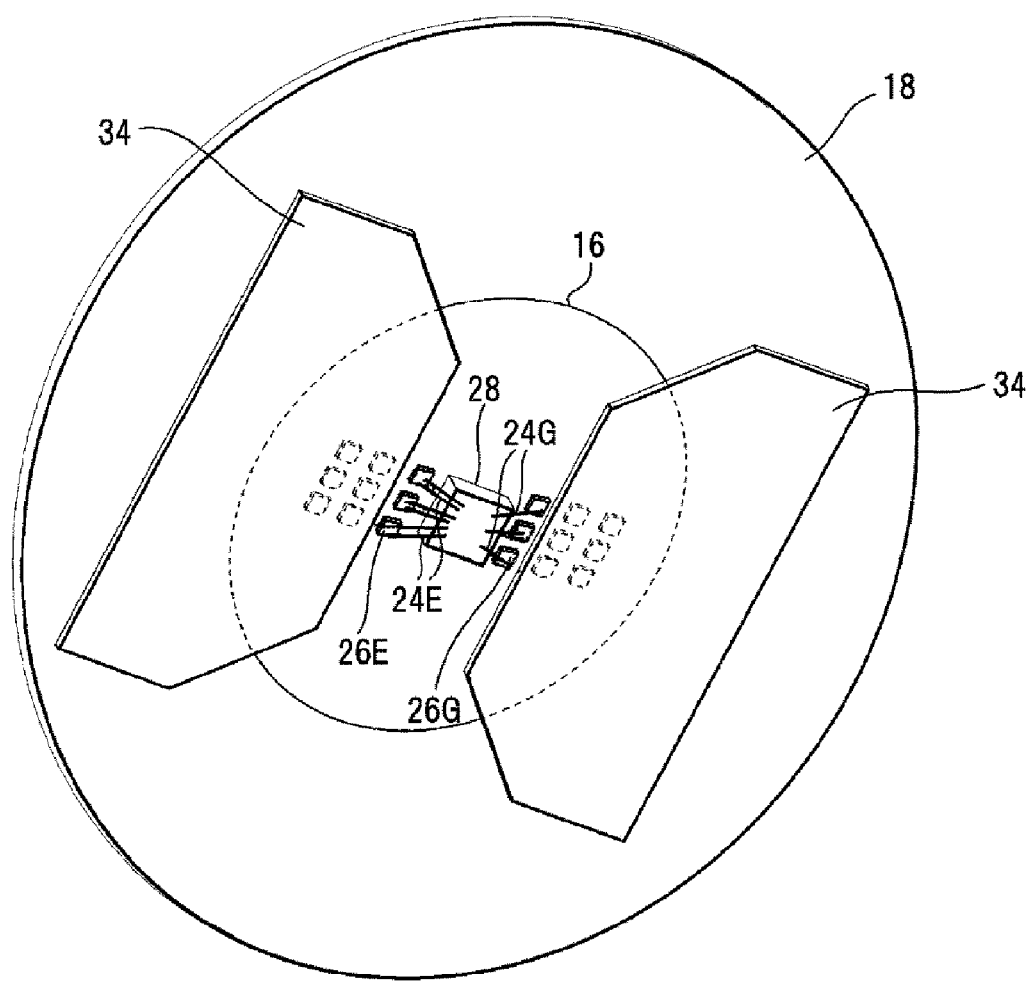
FIG. 2 is a perspective view illustrating a configuration in a vicinity of a probe card of the probe apparatus seen from obliquely below.

FIG. 1 illustrates a configuration of a probe apparatus in accordance with an example embodiment, and FIG. 2 illustrates a configuration in a vicinity of a probe card of the probe apparatus seen from obliquely below.

This probe apparatus is configured to inspect a semiconductor wafer W on which a pre-process of a semiconductor process has been performed. Specifically, the probe apparatus is configured to inspect electrical characteristics of a multiple number of power devices (e.g., power IGBTs) at wafer level. Here, each of the power devices is formed on the semiconductor wafer W and has electrodes formed on both sides of the chip, i.e., formed on both sides of the wafer W.

The probe apparatus includes, within a probe chamber 10 provided in the vicinity of a tester body (not shown) and formed of a housing (not shown), a chuck top (mounting table) 12 placed on a moving stage 14; and a probe card 16 provided above the chuck top 12 and horizontally supported (fastened) by a probe card holder 18. A test head 20 of the tester is configured to dock on the probe card 16 and the probe card holder 18 in a detachable manner.

To elaborate, the chuck top 12 includes a circular mounting surface on which the semiconductor wafer W as the inspection target object is horizontally mounted. The mounting surface is formed of a plate-shaped mounting surface conductor 22 made of, but not limited to, oxygen-free copper having high electric conductivity. If the semiconductor wafer W is mounted on the mounting surface conductor 22, electrodes (collector electrodes) exposed on a rear surface of the semiconductor wafer W at a chip unit are brought into direct contact with and electrically connected with the mounting surface conductor 22. The mounting surface conductor 22 of the chuck top 12 is a major feature of the example embodiment, and the configuration and the operation thereof will be described below in detail.

The moving stage 14 is configured to move the chuck top 12 in a horizontal (XY) direction, a vertical (Z) direction and a rotating (θ) direction. Further, the moving stage 14 is also configured to fix (stop) the chuck top 12 at a certain position within a moving range.

The probe card 16 is manufactured as one kind of printed circuit board, and includes one or more probe needles 24G and 24E to be brought into contact with electrodes (gate electrodes, emitter electrodes) exposed on a front surface of the semiconductor wafer W at a chip unit individually or in common. To be more specifically, base ends or base portions of the probe needles 24G and 24E are bonded to lower ends of corresponding connection conductors 26G and 26E of the probe card 16, respectively. Further, middle portions of the probe needles 24G and 24E are supported by an insulating supporting member 28 protruded from a bottom surface of the probe card 16, and leading ends (free ends) of the probe needles 24G and 24E are brought into contact with the corresponding electrodes (gate electrodes, emitter electrodes) exposed on the front surface of the semiconductor wafer W.

The connection conductors 26G and 26E are vertically inserted into through holes 30G and 30E of the probe card 16, and exposed or protruded above and below the probe card 16, respectively. As shown in the drawing, in a docking state, upper ends or top surfaces of the connection conductors 26G and 26E are brought into direct electric contact with corresponding terminals 32G and 32E of the test head 20, respectively. Here, in order to achieve stable electric connection between the test head 20 and the probe card 16 in the docking state, it may be possible, for example, to provide springs (not shown) on the side of the terminals 32G and 32E of the test head 20.

The probe card holder 18 is a strong metal plate and forms a top surface of the probe chamber 10. The probe card holder 18 is horizontally extended around the probe card 16 to surround the probe card 16. The probe card 16 is detachably or replaceably fastened in an opening formed in a central portion of the probe card holder 18.

The probe card holder 18 is configured to support a conductive contact plate 34 while spaced apart from a bottom surface of the probe card holder 18. In this example embodiment, a pair of left and right contact plates 34 is horizontally disposed between the probe card holder 13 and the chuck top 12 not to interfere with the probe needles 24G and 24E of the probe card 16. Insulating bolts 36 are inserted into through holes of the probe card holder 18 from above. By screwing leading ends of the bolts 36 into screw holes 35 of the contact plate 34, the contact plate 34 is horizontally held.

A pad-shaped pate top surface terminal 38 is formed at a central portion of a top surface of each contact plate 34. The plate top surface terminal 38 is electrically connected to a lower end of a vertically extended rod-shaped or block-shaped connection conductor 40 by direct contact or by soldering. The connection conductor 40 is inserted into a through hole 42 of the probe card holder 18, and exposed or protruded on the probe card holder 18. As depicted in FIG. 1, in the docking state with the test head 20, an upper end or a top surface of the connection conductor 40 is electrically connected to a corresponding terminal 32C of the test head 20 in direct contact manner.

For example, in order to achieve stable electric connection in the docking state, it may be possible to provide a spring (not shown) on the side of the terminal 32C of the test head 20. Further, a conductive sleeve or a packing (not shown) may be inserted into the through hole 42 to allow the connection conductor 40 to be supported by the probe card holder 18. Further, the pair of left and right terminals 32C of the test head 20 corresponding to the pair of contact plates 34 are electrically connected in common in the test head 20.

A pair of contactors 44 capable of being independently brought into contact with bottom surfaces of the pair of left and right contact plates 34 is provided at left and right positions on a side surface of the chuck top 12. At any position of the chuck top 12 within its moving range, if one of the contactors 44 is moved upward (reciprocating) from an original position to a certain height position, an upper end or a top surface of that contactor 44 may be come into contact with the bottom surface of the facing contact plates 34.

In this example embodiment, each contactor 44 is implemented by, but not limited to, a probe pin. Further, there is provided an elevating device 45 capable of controlling a vertical movement and a vertical position of the contactor 44 independently from the moving stage 14. Further, it may be possible to provide a spring (not shown) at the contactor 44 in order to achieve stable electric connection between the contactor 44 and the contact plate 34. Each contactor 44 is electrically connected to the mounting surface conductor 22 via a flexible connection conductor, e.g., a hard wire 46, which is extended outward from a peripheral edge of the chuck top 12.

A dynamic characteristic of each chip (power device) on the semiconductor wafer W is inspected in this probe apparatus as follows. The test head 20 of the tester is in a docking state as depicted in FIG. 1, the semiconductor wafer W is downwardly spaced apart from the leading ends of the probe needles 24G and 24E, and the contactors 44 are also downwardly spaced apart from the contact plates 34. In this state, alignment of an inspection target chip (power device) on the semiconductor wafer W with the probe card 16 or the probe needles 24G and 24E is performed. For the alignment, by moving the chuck top 12 on the moving stage 14 in the horizontal (XY) direction, the electrodes (the gate electrode and the emitter electrode) on the front surface, i.e., front surface electrode, of the inspection target chip are located directly under the leading ends of the corresponding probe needles 24G and 24E.

Subsequently, the chuck top 12 is moved vertically upward by a certain stroke, the electrodes (the gate electrodes and the emitter electrode) on the front surface of the inspection target chip press against the corresponding probe needles 24G and 24E from below. Accordingly, electric conduction is achieved between the electrodes (the gate electrode and the emitter electrode) on the front surface of the inspection target chip and the corresponding terminals 32G and 32E of the test head 20 via an incoming measurement line, which includes the connection conductors 26G and 26E and the probe needles 24G and 24E of the probe card 16.

Meanwhile, by moving upward (reciprocating) either one of the left and right contactors 44, the upper end or the top surface of that contactor 44 is bought into contact with the bottom surface of the contact plate 34. Accordingly, electric conduction is achieved between an electrode (collector electrode) on a rear surface, i.e., rear surface electrode, of the inspection target chip and the corresponding terminal 32C of the test head 20 via an outgoing measurement line, which includes the mounting surface conductor 22 of the chuck top 12, the hard wire 46, the corresponding one contactor 44, the corresponding one contact plate 34 and the corresponding one connection conductor 40.

As stated above, the electric conduction is achieved between the respective electrodes (the gate electrode, the emitter electrode and the collector electrode) of the inspection target chip, i.e., the power device on the semiconductor wafer W and the corresponding terminals 32G, 32E and 32C of the test head 20. In this state, if a preset high voltage is applied between the collector electrode and the emitter electrode of the corresponding power device from the tester through the outgoing measurement line and the incoming measurement line and a preset control pulse is applied to the gate electrode, a pulse of a current is outputted from the corresponding power device, and the pulse of the current is sent to the tester through the outgoing measurement line and the incoming measurement line. At this time, a power loss due to an impedance resistance may be generated on the outgoing and incoming measurement lines. The tester evaluates a dynamic characteristic by measuring, for example, a turn-on or turn-off time, or a starting or ending time through the signal processing based on the pulse introduced to the terminal 32C or the terminal 32E of the test head 20, and then, determines the faults of the corresponding power device.

In this probe apparatus, besides the above-described inspection of the dynamic characteristic, inspection of the static characteristic such as a breakdown voltage test or on-resistance measurement can be performed in the same way as described above excepting that a voltage or a control signal applied from the tester is different.

This probe apparatus includes an attracting device 50, which will be described in detail below, in order to hold the semiconductor wafer W on the mounting surface conductor 22 of the chuck top 12. The attracting device 50 has many vertical fine holes 52 distributed in the mounting surface conductor 22 of the chuck top 12 at a high density of about 300 times as high as that of the conventional hole type device. With this configuration, a contact resistance (wafer contact resistance) may be greatly reduced and uniformized between the electrode (collector electrode) on the rear surface of the semiconductor wafer W and the mounting surface conductor 22 of the chuck top 12. By reducing and uniformizing the wafer contact resistance, it may be possible to improve power consumption efficiency and measurement accuracy in inspecting the electrical characteristics of the power device on the semiconductor wafer W.

The incoming measurement line and the outgoing measurement line configured to make the electric conduction state between each electrode of the power device to be inspected and each corresponding terminal of the test head 20 are set to be as short as possible. Especially, in case of the incoming measurement line, the base ends of the probe needles 24G, 24E and the corresponding terminals 32G, 32E of the test head 20 are arranged to directly face each other in the vertical direction, and thus, are electrically connected with each other at a shortest distance via the connection conductors 26G and 26E of the probe card 16.

Further, as a relay device for achieving electric conduction between the electrode (collector electrode) on the rear surface of the power device to be inspected and the corresponding terminal 32C of the tester, the contact plates 34 are disposed between the probe card holder 18 and the chuck top 12, and the contactors 44 electrically connected to the mounting surface conductor 22 are fastened to the lateral surface of the chuck top 12 to be vertically moved. The mounting surface conductor 22 is electrically connected to the contact plate 34 at a shortest distance via the contactors 44. Further, the plate top surface terminal 38 of the contact plate 34 and the corresponding terminal 32C of the test head 20 are also arranged to directly face each other in the vertical direction, and thus, are electrically connected to each other at a shortest distance via the rod-shaped (or block-shaped) connection conductor 40 inserted into the through hole 42 of the probe card holder 18 in the electrically contact manner. In this way, by minimizing the lengths of the outgoing and incoming measurement lines, impedance of these measurement lines may be reduced, so that the power consumption efficiency and the measurement accuracy in inspecting the electrical characteristics of the power device on the semiconductor wafer W may be further improved.

(Configuration and Operation of Attracting Device)

Figure 3:
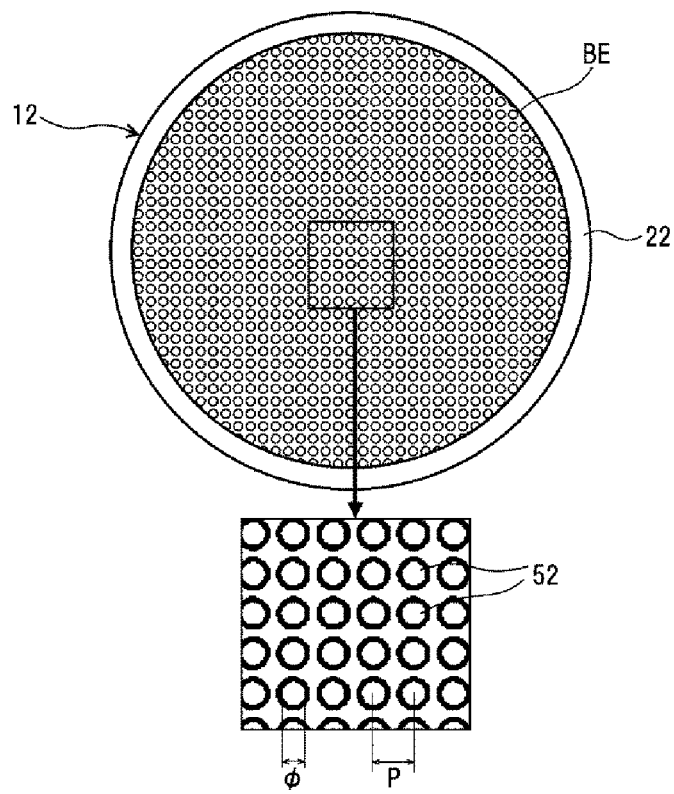
FIG. 3 is a plane view illustrating an attraction region and vertical fine holes on a mounting surface of a chuck top in the probe apparatus.

In this example embodiment, as depicted in FIG. 3, the attracting device 50 has the many vertical fine holes 52 distributed in a circular attraction region BE set on the mounting surface of the chuck top 12 at a regular high density in, e.g., a lattice shape. A diameter φ and a pitch p of each of the vertical fine holes 52 are set to be, e.g., φ=about 0.25 mm, p=about 0.5 mm. As compared to the suction holes in the conventional hole type attracting device, the diameter φ is reduced to about ½ and the pitch p is reduced to about 1/20.

Figure 4:
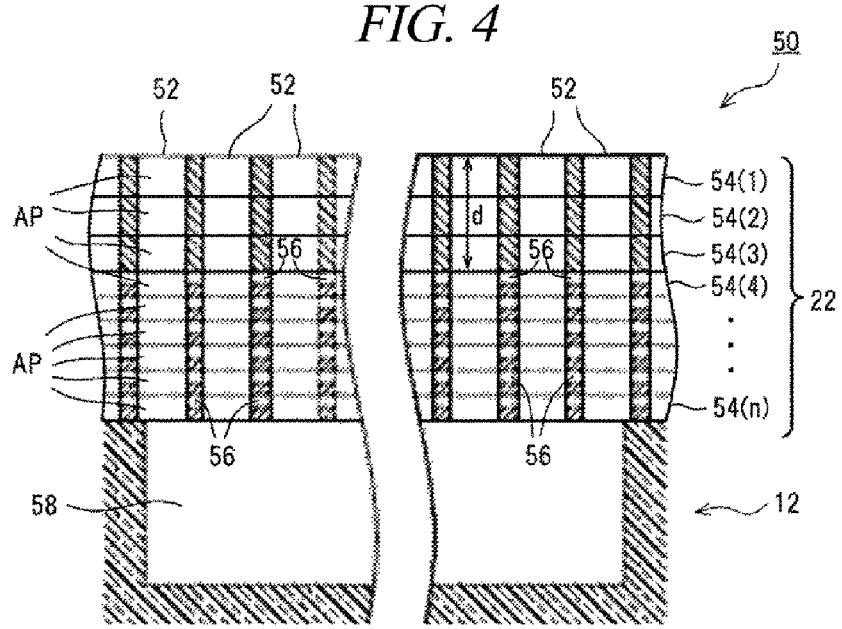
FIG. 4 is a longitudinal cross sectional view illustrating an internal configuration of a mounting surface conductor of the chuck top.

It is difficult in the technical aspect and in the aspect of cost as well to form the vertical fine holes 52 having such a high density in the mounting surface conductor 22 by the mechanical machining. In this example embodiment, as shown in FIG. 4, at least a surface layer of the mounting surface conductor 22 is formed of a multiple number (e.g., about 10 sheets to 20 sheets) of thin plate conductors 54(1), 54(2), . . . , 54(n) which are stacked on top of each other. Here, each of the thin plate conductors has openings AP at respective positions corresponding to the vertical fine holes 52, and each of the openings AP has the same diameter as that of each of the vertical fine holes 52. Each thin plate conductor 54(i) (i ranges from 1 to n) is made of the same material as that of the mounting surface conductor 22, i.e., oxygen-free copper.

In each thin plate conductor 54(i), the openings AP are formed in the same pattern, i.e., the same diameter φ and the same pitch p by the etching process (typically, wet etching process). Since the openings AP are formed by the etching process, a process deformation or a burr may not be generated in the vicinity of the openings AP.

Figure 5:
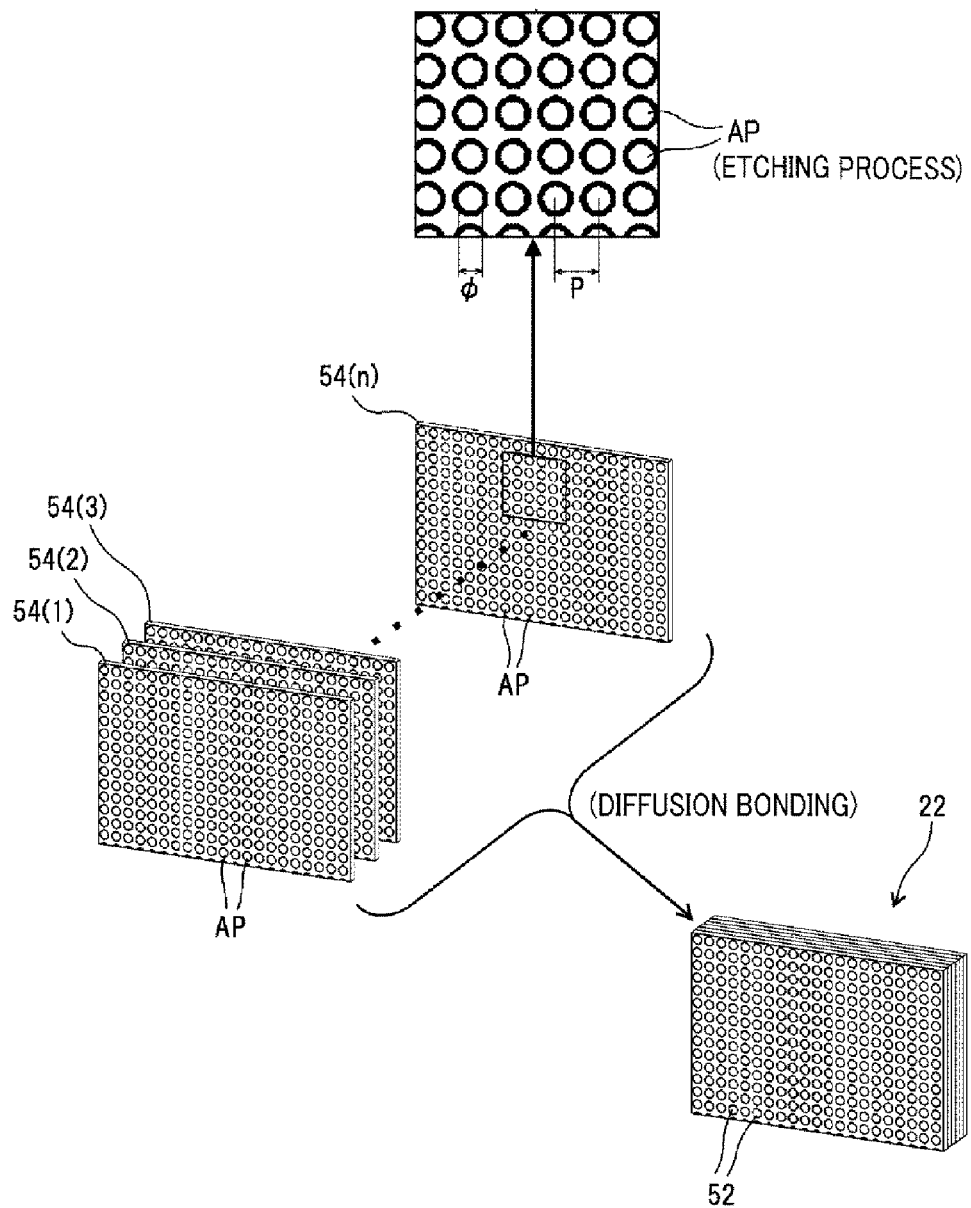
FIG. 5 is a perspective view for schematically describing a manufacturing process of the mounting surface conductor.

Then, as shown in FIG. 5, the multiple number of thin plate conductors 54(1), 54(2), . . . , 54(n) are stacked on top of each other such that openings AP at corresponding positions are aligned in a single row. Then, the thin plate conductors 54(1), 54(2), . . . , 54(n) are bonded to each other by diffusion bonding. Here, the diffusion bonding is a bonding technique through atom diffusion by heating and pressurizing a base material without dissolving it. The mounting surface conductor 22 having a laminated structure in which the thin plate conductors 54(1), 54(2), . . . , 54(n) are bonded as one body by the diffusion bonding is provided with the vertical fine holes 52 having the same pattern as the openings AP of each thin plate conductor 54(i), i.e., having the same diameter φ and the same pitch p.

As illustrated in FIG. 4, in the mounting surface conductor 22, the vertical fine holes 52 are separated from each other in a region having to a preset depth d (desirably, about 0.5 mm to about 3 mm) from the surface of the mounting surface conductor 22. Accordingly, a vacuum attracting force applied to the semiconductor wafer W from the vertical fine holes 52 may be exerted vertically downward at each position. In an inner deep region of the mounting surface conductor 22 over the preset depth p, horizontally extended communication paths or grooves 56 are formed between the adjacent vertical fine holes 52, and a groove-shaped vacuum passage 58 having an open top is formed in a lower portion of or under the mounting surface conductor 22. The vacuum passage 58 is directly connected to the vertical fine holes 52 located directly above the vacuum passage 58, and is also connected via the communication paths 56 to the adjacent vertical fine holes 52 which are not located directly thereabove.

Figure 6A:
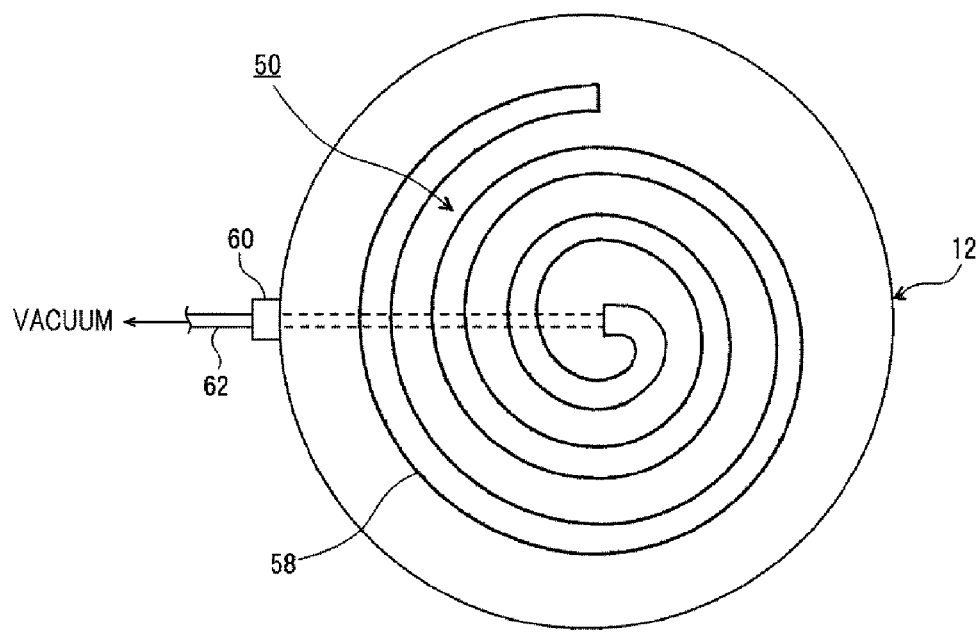
FIG. 6A is a substantially plane view illustrating an example layout of a vacuum passage in an attracting device.

The vacuum passage 58 is continuously extended in a spiral shape within the chuck top 12, as shown in FIG. 6A, for example. A beginning of the vacuum passage 58 positioned at a central portion of the chuck top 12 is connected to a vacuum source (decompression source) such as a vacuum pump (not shown) via a connector or joint 60 and an external vacuum pipe 62. In this configuration, if a semiconductor wafer W is mounted on the mounting surface conductor 22 of the chuck top 12 and the attracting device 50 is driven, a vacuum attracting force from the vacuum pump may be first exerted on a central portion of the semiconductor wafer W at a position directly above the beginning of the spiral vacuum passage 58. Then, the vacuum attracting force may be exerted on each portion of the semiconductor wafer W at a position directly above each portion of the spiral vacuum passage 58 starting from the center of the semiconductor wafer W toward the edge thereof in a radial direction. Accordingly, each portion of the semiconductor wafer W may be attracted to the mounting surface conductor 22 sequentially from the center of the semiconductor wafer W toward the edge thereof in the radial direction. Thus, even if the semiconductor wafer W is bent, the bending of the semiconductor wafer W may be corrected, and a rear surface of the semiconductor wafer W can be brought into firm contact with the mounting surface conductor 22 in a plane surface state.

Figure 6B:
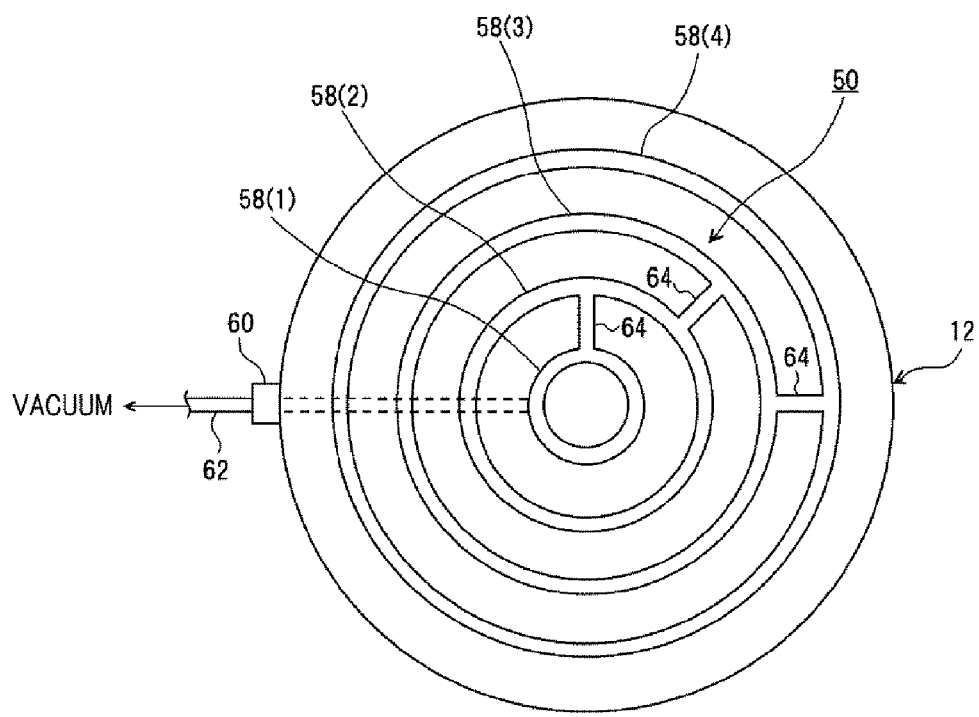
FIG. 6B is a substantially plane view illustrating another example layout of the vacuum passage.
Figure 8A:
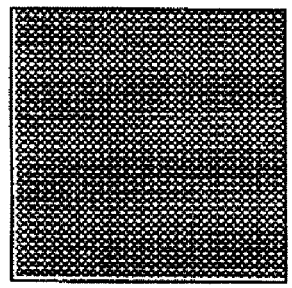
FIG. 8A to FIG. 8E are plane views illustrating several appropriate examples of a pattern (diameter and pitch) of the vertical fine holes in accordance with the example embodiment.
Figure 8B:
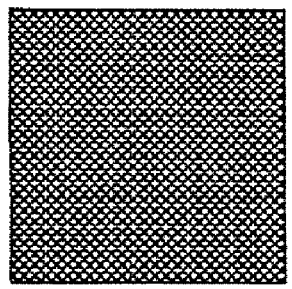
Figure 8C:
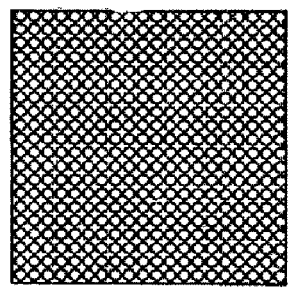
Figure 8D:
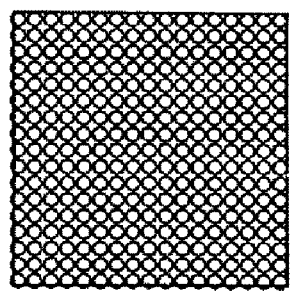
Figure 8E:
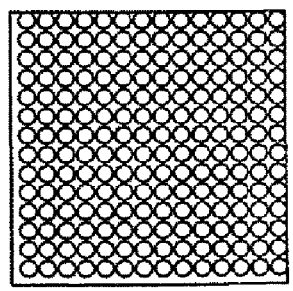
Figure 9:
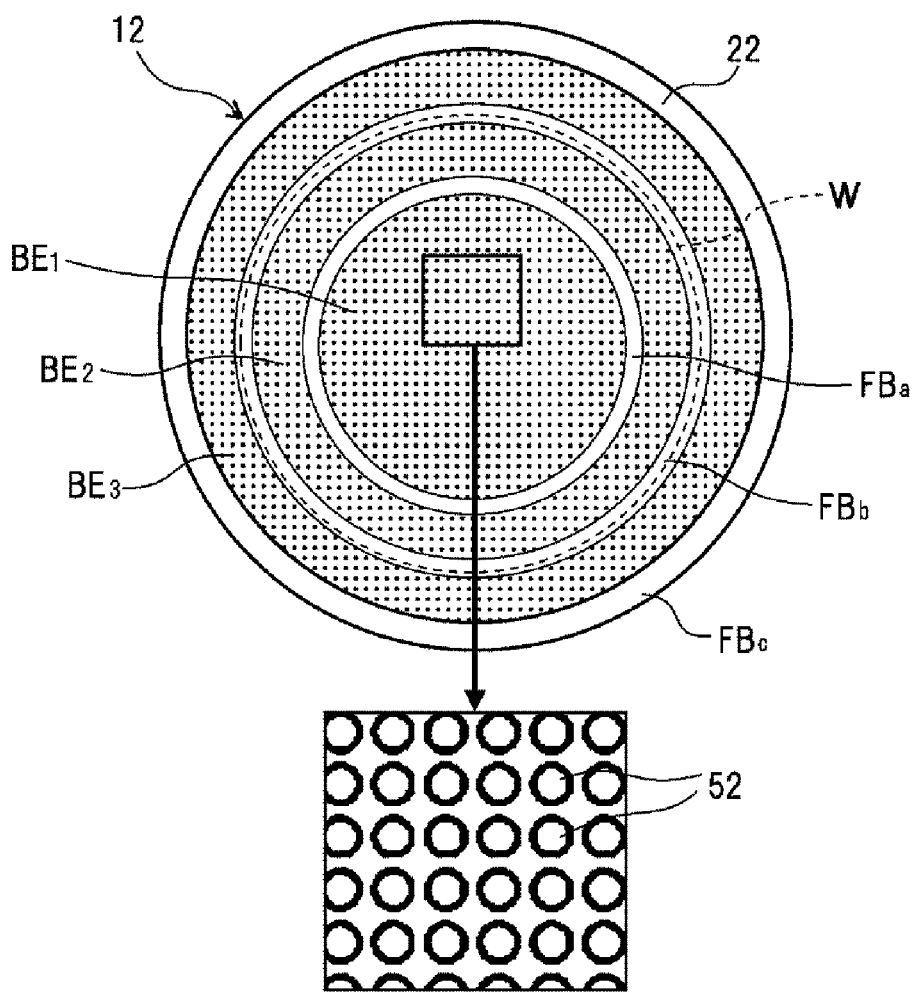
FIG. 9 is a plane view illustrating a modification example of the attraction region on the mounting surface of the chuck top.

Alternatively, as shown in FIG. 6B, the vacuum passage 58 may be divided into plural concentric annular paths 58(1), 58(2), 58(3) and 58(4) within the chuck top 12, and the annular paths 58(1), 58(2), 58(3) and 58(4) may be connected to each other via communication paths 64 extended in the radial direction. In such a case, the innermost annular path 58(1) (having the smallest diameter) is connected to the vacuum pump via the connector 60 and the external vacuum pipe 62. It may be possible to provide a pressure delay circuit (not shown) on the communication paths 64.

In this configuration, if a semiconductor wafer W is mounted on the mounting surface conductor 22 of the chuck top 12 and the attracting device 50 is driven, a vacuum attracting force from the vacuum pump may be first exerted on the central portion of the semiconductor wafer W at a position directly above the innermost annular path 58(1). Then, the vacuum attracting force may be exerted on each portion of the semiconductor wafer W at positions directly above the annular paths 58(2), 58(3) and 58(4) in sequence from the center of the semiconductor wafer W toward the edge thereof in a radial direction. Accordingly, each portion of the semiconductor wafer W may be attracted to the mounting surface conductor 22 sequentially from the center of the semiconductor wafer W toward the edge thereof in the radial direction. Thus, even if the semiconductor wafer W is bent, the bending of the semiconductor wafer W may be corrected, and a rear surface of the semiconductor wafer W can be brought into firm contact with the mounting surface conductor 22 in a plane surface state.

As described above, in the attracting device 50 of the example embodiment, the many vertical fine holes 52 are formed in the mounting surface conductor 22 of the chuck top 12, and each of the vertical fine holes 52 has a diameter φ of, e.g., about 0.25 mm, a pitch p of, e.g., about 0.5 mm and an opening ratio AR of, e.g., about 19.6%.

FIG. 7A is a longitudinal cross sectional view illustrating a state in which a semiconductor wafer having a thickness $t_w$ ($t_w$=125 μm for a wafer having a diameter of, e.g., about 6 inches) is attracted to the mounting surface conductor 22 through vertical fine holes 52 of an experimental example. FIG. 7B is a longitudinal cross sectional view illustrating a state in which the same semiconductor wafer W is attracted to the mounting surface conductor 22 through vertical holes 70 of a comparative example. Here, each of the vertical holes 70 of the comparative example has a diameter φ' of, e.g., about 0.50 mm, a pitch p' of, e.g., about 10 mm and an opening ratio AR' of, e.g., about 0.196%, and the vertical holes 70 correspond to the suction holes in the conventional hole type attracting device. In these drawings, a diameter s of a leading end of a probe needle (e.g., a cantilever needle) 24 shown to be in contact with a surface of the semiconductor wafer W is about 100 μm.

As shown in FIG. 7A and FIG. 7B, in the experimental example (FIG. 7A) and the comparative example (FIG. 7B), the pitch p of the vertical fine hole 52 and the pitch p' of the vertical hole 70 are different by a single digit (exactly, about 20 times); the hole density is different by two digits (exactly, about 400 times); and the opening ratio is different by two digits (exactly, about 100 times). Accordingly, in comparison of the experimental example (FIG. 7A) and the comparative example (FIG. 7B), a contact stress uniformity and a contact resistance (wafer contact resistance) between the semiconductor wafer W and the mounting surface conductor 22 may be greatly different.

Further, in the present example embodiment, the configuration in which the above-described vertical fine holes 52 of high density are formed in the mounting surface conductor 22 is totally different from a configuration in which at least a surface layer of the mounting surface conductor 22 is formed of a so-called porous metal. That is, in view of a holding effect for holding the semiconductor wafer W at a certain position on the chuck top 12, there may be found no great difference between the vertical fine holes 52 of the example embodiment and the porous metal. However, in consideration of an effect of reducing a contact resistance (wafer contact resistance) between an electrode on the rear surface of the semiconductor wafer W and the mounting surface conductor 22 and an electrical resistivity of the mounting surface conductor, the porous metal is much inferior to the high-density vertical fine holes 52 of the example embodiment, and thus, is not suitable for the mounting surface conductor 22. Especially, in an inspection in which a current of several hundreds of ampere (A) is flown by applying a voltage of several thousands of volt (V) to a power device, the porous metal having a high wafer contact resistance and a high electric resistivity may not be used as the mounting surface conductor 22. In the present example embodiment, by adopting the configuration in which the aforementioned high-density vertical fine holes 52 are formed in the mounting surface conductor 22, it may be possible to flow even a current of several hundreds of ampere (A) or more stably at a low power loss in inspecting the electrical characteristic of the power device.

In the present example embodiment, since the high-density vertical fine holes 52 are formed in the mounting surface conductor 22 by using the etching or the diffusion bonding technique, the diameter $\phi$, the pitch p and the opening ratio AR can be selected in a wider range. By way of example, as shown in FIG. 8A to FIG. 8E, patterns as follows may be appropriately selected.

(FIG. 8A) $\phi$=0.2 mm, pitch (p)=0.3 mm, AR=34%
(FIG. 8B) $\phi$=0.3 mm, pitch (p)=0.4 mm, AR=44%
(FIG. 8C) $\phi$=0.4 mm, pitch (p)=0.5 mm, AR=50%
(FIG. 8D) $\phi$=0.5 mm, pitch (p)=0.6 mm, AR=57%
(FIG. 8E) $\phi$=0.6 mm, pitch (p)=0.7 mm, AR=55%

In all of these examples, the condition of $\phi < p \leq 2\phi$ is satisfied, as in the above-described experimental example ($\phi$=about 0.25 mm, pitch (p)=about 0.5 mm).

OTHER EXAMPLE EMBODIMENTS OR MODIFICATION EXAMPLES

In the above-described example embodiment, the attraction region BE is set on the mounting surface of the chuck top 12, and the high-density vertical fine holes 52 are formed on this attraction region BE. Here, as a modification example of the attraction region BE, depending on a size (diameter) of a semiconductor wafer W to be inspected, one or more mirror-surfaced annular partitions $FB_a$ and $FB_b$ without having vertical fine holes 52 may be concentrically provided, so that the attraction region may be divided into plural (three in the shown example) regions $BE_1$, $BE_2$ and $BE_3$ in a radial direction.

By way of example, a semiconductor wafer W having a diameter of about 4 inches (about 100 mm) may be mounted such that the entire circumference of the edge of the semiconductor wafer W is arranged within the inner or smaller-diameter annular partition $FB_a$. Here, the mirror-surfaced or plane-surfaced annular partition $FB_a$ may allow the edge of the wafer to be optically detected by using an imaging device. In this case, on the first attraction region $BE_1$ at a central position, the semiconductor wafer W may be fixed to the mounting surface conductor 22 in firm contact with it by the vacuum attracting force from vertical fine hole 52 within the first attraction region $BE_1$.

As another example, a semiconductor wafer W having a diameter of about 6 inches (about 150 mm) may be mounted such that the entire circumference of the edge of the semiconductor wafer W is arranged within an outer or larger-diameter annular partition $FB_b$. Here, the plane-surfaced annular partition $FB_b$ may allow the edge of the wafer to be optically detected by using an imaging device. In this case, on the first and second attraction regions $BE_1$ and $BE_2$, the semiconductor wafer W may be fixed to the mounting surface conductor 22 in firm contact with it by the vacuum attracting force from vertical fine hole 52 within the first and second attraction regions $BE_1$ and $BE_2$.

As still another example, a semiconductor wafer W having a diameter of about 8 inches (about 200 mm) may be mounted such that the entire circumference of the edge of the semiconductor wafer W is arranged within an annular edge peripheral portion $FB_C$. Here, the plane-surfaced annular edge peripheral portion $F_c$ may allow the edge of the wafer to be optically detected by using an imaging device. In this case, on all (first, second and third) attraction regions $BE_1$, $BE_2$ and $BE_3$, the semiconductor wafer W may be fixed to the mounting surface conductor 22 in firm contact with it by the vacuum attracting force from vertical fine hole 52 within the first, second and third attraction regions $BE_1$ $BE_2$ and $BE_3$.

Figure 10:
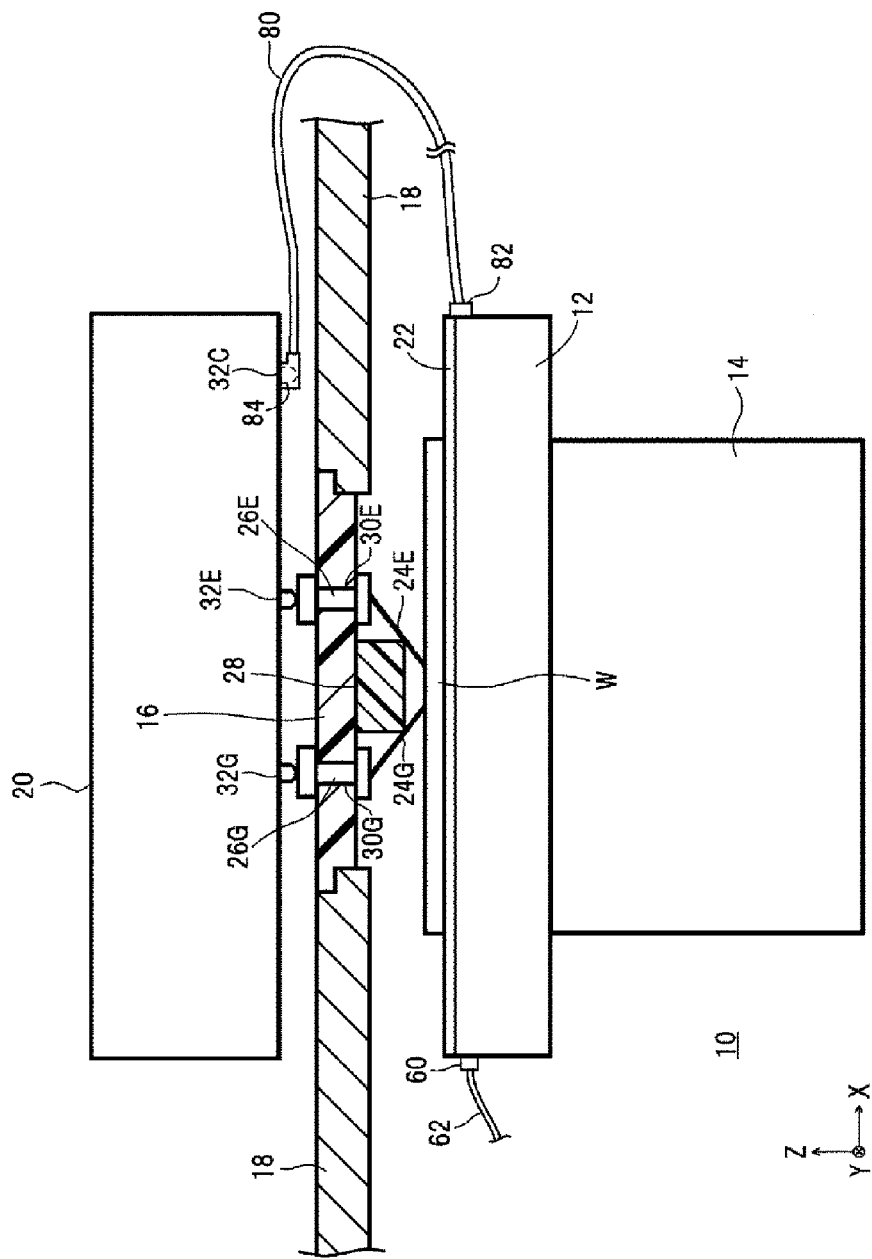
FIG. 10 is a partially cross sectional front view illustrating a configuration of a probe apparatus in accordance with another example embodiment.

FIG. 10 illustrates a configuration of a probe apparatus in accordance with another example embodiment. Like the probe apparatus in the above-described first example embodiment, the probe apparatus of the second example embodiment is also configured to inspect electrical characteristics (dynamic characteristics and static characteristics) of a multiple number of power devices at wafer level. Here, each of the power devices is formed on a semiconductor wafer W and has electrodes on both sides of the chip, i.e., on both sides of the wafer W. The probe apparatus inspects every chip at wafer level.

Meanwhile, the contact plate 34 (FIG. 1) is not provided (accordingly, the contactors 44 and the connection conductor 40 are not provided) as the outgoing measurement line for achieving electric conduction between a rear surface electrode of a power device to be inspected and a tester. Instead, the probe apparatus of the second example embodiment adopts a configuration in which an electric cable 80 is routed from the mounting surface conductor 22 of the mounting table 12 to the corresponding terminal 32C of the test head 20. Both ends of the electric cable 80 are connected to the mounting surface conductor 22 and the terminal 32C via connectors 82 and 84, respectively.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A probe apparatus of inspecting an electrical characteristic of a power device that is formed on a substrate to be inspected and has electrodes on front and rear surfaces of the substrate, the probe apparatus comprising:
   a movable chuck top configured to mount and support the substrate thereon;
   a probe card that is provided above the chuck top to face the chuck top and is configured to support a probe needle having a leading end to be brought into contact with a front surface electrode of the power device exposed at the front surface of the substrate supported on the chuck top;
   a first measurement line, having the probe needle, configured to electrically connect the front surface electrode of the power device to a corresponding first terminal of a tester;

a mounting surface conductor that serves as a mounting surface on the chuck top and is configured to be brought into contact with a rear surface electrode of the power device exposed at the rear surface of the substrate;

a second measurement line, having the mounting surface conductor, configured to electrically connect the rear surface electrode of the power device to a corresponding second terminal of the tester; and an attracting device, having many vertical fine holes which are densely distributed in an attraction region set on the mounting surface and each of which is vertically extended from a surface of the mounting surface conductor to an inner portion thereof, configured to apply a vacuum attracting force to the rear surface of the substrate through the vertical fine holes, wherein, in the attraction region, the vertical fine hole satisfies a condition of $\phi < p \leq 2\phi$ when $\phi$ denotes a diameter of the vertical fine hole and p denotes a pitch therebetween.

2. The probe apparatus of claim 1,
wherein a density of the vertical fine holes is equal to or higher than about 100 holes/cm$^2$.

3. The probe apparatus of claim 2,
wherein the density of the vertical fine holes is equal to or higher than about 400 holes/cm$^2$.

4. The probe apparatus of claim 1,
wherein the diameter $\phi$ of the vertical fine hole is in the range from about 0.2 mm to about 0.6 mm.

5. The probe apparatus of claim 1,
wherein, in the attraction region, an opening ratio of the vertical fine holes is in the range from about 20% to about 60%.

6. The probe apparatus of claim 1,
wherein at least a surface layer of the mounting surface conductor is formed of a plurality of thin plate conductors stacked on top of each other, and each of the thin plate conductors has openings at positions corresponding to the vertical fine holes and each of the openings has the same diameter as that of each of the vertical fine holes.

7. The probe apparatus of claim 6,
wherein the openings of the thin plate conductor are formed by an etching process.

8. The probe apparatus of claim 6,
wherein the thin plate conductors are joined to each other by a diffusion bonding.

9. The probe apparatus of claim 1,
wherein the vertical fine holes are separated from each other in a region having a preset depth from the surface of the mounting surface conductor.

10. The probe apparatus of claim 9,
wherein, in an inner deep region exceeding the preset depth in the mounting surface conductor, a communication path is formed between the adjacent vertical fine holes.

11. The probe apparatus of claim 9,
wherein the preset depth is in the range from about 0.5 mm to about 3 mm.

12. The probe apparatus of claim 1,
wherein the attracting device comprises a vacuum passage that is provided in an inside of or under the mounting surface conductor to be connected to lower ends of the vertical fine holes at respective positions in the attraction region, and is connected to a vacuum source.

13. The probe apparatus of claim 12,
wherein the vacuum passage is extended in a spiral shape from a central portion of the mounting surface to a periphery portion thereof in a radial direction or is arranged concentrically, and the central portion of the mounting surface is positioned at an upstream side with respect to the vacuum source, and the periphery portion of the mounting surface is positioned at a downstream side.

14. The probe apparatus of claim 1,
wherein, in the attracting device, the substrate is first attracted at the central portion of the mounting surface, and then, the substrate is sequentially attracted from the central portion of the mounting surface toward the periphery portion thereof.

* * * * *